(12) United States Patent
Rijken et al.

(10) Patent No.: US 8,335,077 B2
(45) Date of Patent: Dec. 18, 2012

(54) INSULATING APERTURE IN PRINTED CIRCUIT BOARDS

(75) Inventors: Christopher N. Rijken, Houston, TX (US); Mark D. Tupa, Cypress, TX (US); Michael R. Durham, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 40 days.

(21) Appl. No.: 12/812,724

(22) PCT Filed: Jan. 31, 2008

(86) PCT No.: PCT/US2008/052562
§ 371 (c)(1),
(2), (4) Date: Jul. 13, 2010

(87) PCT Pub. No.: WO2009/096966
PCT Pub. Date: Aug. 6, 2009

(65) Prior Publication Data
US 2010/0290183 A1 Nov. 18, 2010

(51) Int. Cl.
*H05K 7/20* (2006.01)
(52) U.S. Cl. ......... 361/679.46; 361/679.48; 361/679.54; 361/704; 361/707; 361/720; 257/713; 257/725; 174/252
(58) Field of Classification Search ............... 361/679. 46–679.54, 690–697, 704–712, 715–724, 361/760–767, 782, 783; 174/250–267, 16.3; 257/713–723, 735, 522, 332, 338; 374/1, 374/208, 179, E15, 158.1, 141, 152, 33, 760, 374/754, 765, 763, 100, 120; 29/825–852; 438/353, 355, 359, 404, 405
See application file for complete search history.

(56) References Cited

U.S. PATENT DOCUMENTS

| | | | | |
|---|---|---|---|---|
| 3,493,820 A | * | 2/1970 | Rosvold | 257/522 |
| 4,257,061 A | * | 3/1981 | Chapel et al. | 257/735 |
| 4,803,875 A | * | 2/1989 | Kuhn et al. | 73/204.26 |
| 5,271,272 A | * | 12/1993 | Hueftle et al. | 73/204.26 |
| 5,305,186 A | * | 4/1994 | Appelt et al. | 361/704 |
| 5,319,971 A | * | 6/1994 | Osswald et al. | 73/204.26 |
| 5,372,040 A | * | 12/1994 | Hecht et al. | 73/204.26 |
| 5,375,466 A | * | 12/1994 | Konzelmann | 73/204.26 |
| 5,426,303 A | * | 6/1995 | Owen et al. | 250/332 |
| 5,451,720 A | | 9/1995 | Estes et al. | |
| 5,602,392 A | * | 2/1997 | Owen et al. | 250/338.3 |
| 5,708,205 A | * | 1/1998 | Yamada et al. | 73/204.26 |
| 5,900,649 A | | 5/1999 | Effelsberg | |
| 6,190,941 B1 | | 2/2001 | Heinz et al. | |

(Continued)

FOREIGN PATENT DOCUMENTS

JP 01-93792 U 6/1989
(Continued)

OTHER PUBLICATIONS

IPO, Office Action dated Jun. 20, 2011, GB1012152.3, filed Jul. 8, 2010, PCT/US2008/052562, Int'l Date Jan. 31, 2008. Christopher Rijken, et al., SIPO, First Office Action dated Feb. 3, 2012, Chinese Pat. App. No. 200880125984.9 filed Jul. 8, 2010, priority application PCT/US2008.
Christopher Rijken, Japan Patent Office, First Office Action dated May 15, 2012, JP Pat App No. 2010-544944 filed Jul. 8, 2010.

*Primary Examiner* — Michail V Datskovskiy

(57) ABSTRACT

A system contains a temperature sensitive device and a printed circuit board. The temperature sensitive device is coupled to the printed circuit board. An aperture is cut out of the printed circuit board between the temperature sensitive device and a heat generating device to act as an insulator for the temperature sensitive device.

19 Claims, 6 Drawing Sheets

U.S. PATENT DOCUMENTS

| | | | |
|---|---|---|---|
| 6,205,028 B1 | 3/2001 | Matsumura | |
| 6,573,704 B2 * | 6/2003 | Mirov | 361/707 |
| 6,822,325 B2 * | 11/2004 | Wong | 257/717 |
| 6,880,970 B2 * | 4/2005 | Mirov | 374/208 |
| 6,940,164 B1 * | 9/2005 | Yoshimatsu et al. | 257/725 |
| 7,223,923 B2 | 5/2007 | Ho et al. | |
| 7,317,248 B2 * | 1/2008 | Poechmueller | 257/713 |
| 7,573,713 B2 * | 8/2009 | Hoffman et al. | 361/697 |
| 2002/0080852 A1 | 6/2002 | Mirov | |
| 2002/0124584 A1 * | 9/2002 | Sumida et al. | 62/202 |
| 2006/0049515 A1 | 3/2006 | Poechmueller | |
| 2006/0087820 A1 * | 4/2006 | Yang et al. | 361/760 |
| 2007/0058339 A1 * | 3/2007 | Hoffman et al. | 361/688 |
| 2007/0272435 A1 | 11/2007 | Johnson | |
| 2008/0317087 A1 * | 12/2008 | Kimura | 374/1 |

FOREIGN PATENT DOCUMENTS

| | | |
|---|---|---|
| JP | 3296292 A | 12/1991 |
| JP | 2008-250822 A | 9/1996 |
| JP | 02001221486 A * | 8/1999 |
| JP | 2001-221486 A | 8/2001 |
| JP | 2001221486 A | 8/2001 |
| JP | 2005-223078 | 8/2005 |
| JP | 2005223078 A | 8/2005 |
| JP | 02006339545 A * | 12/2006 |

* cited by examiner

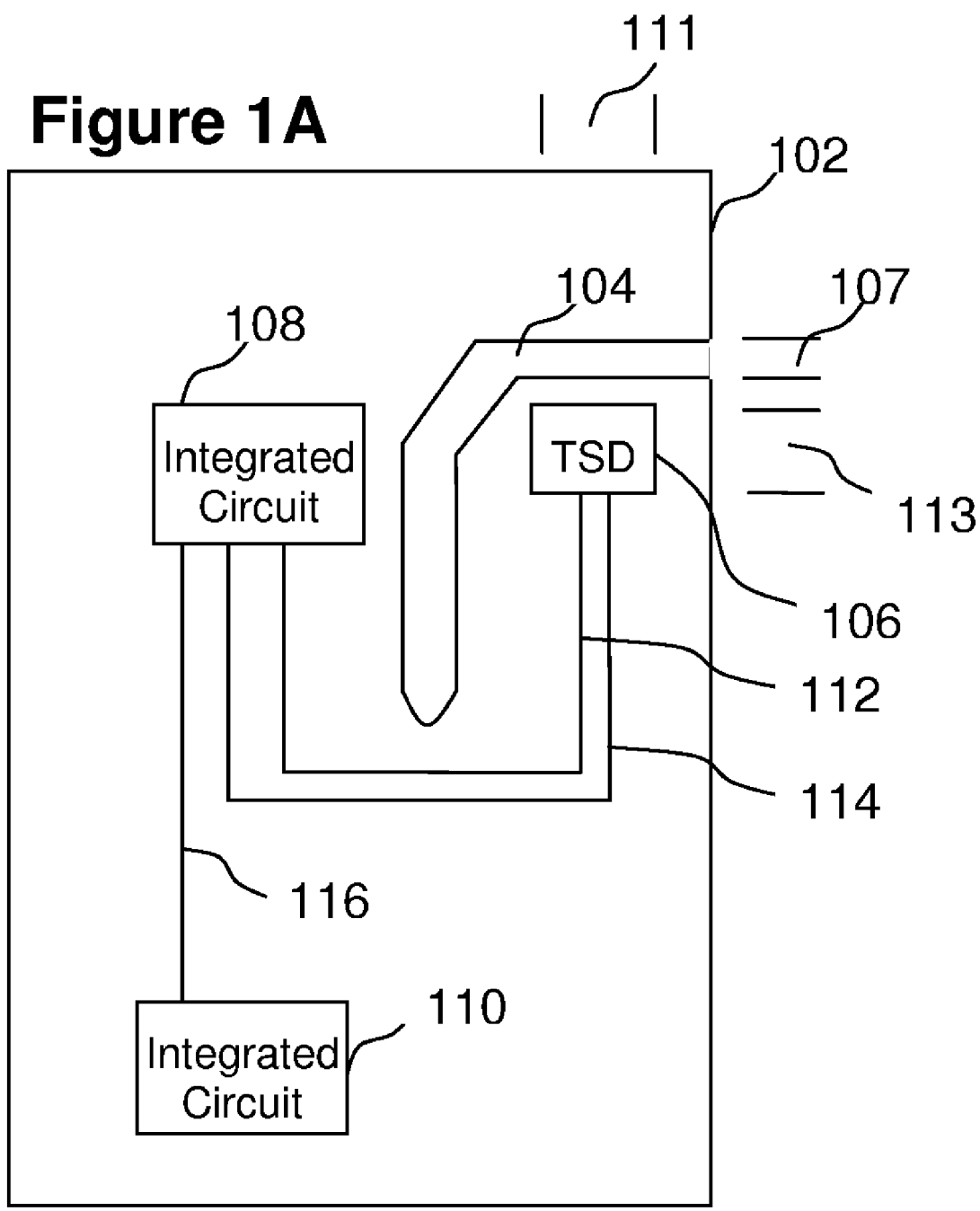

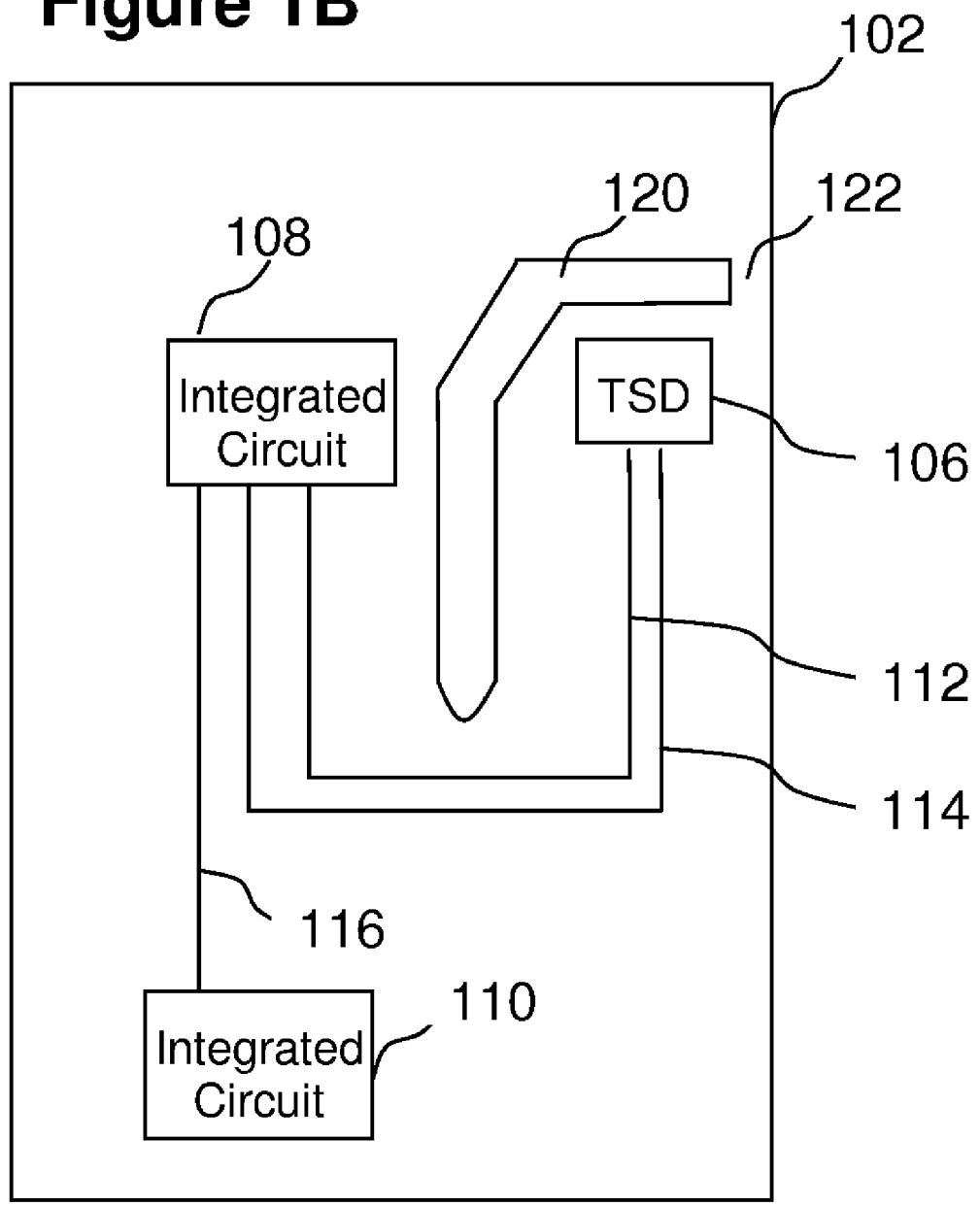

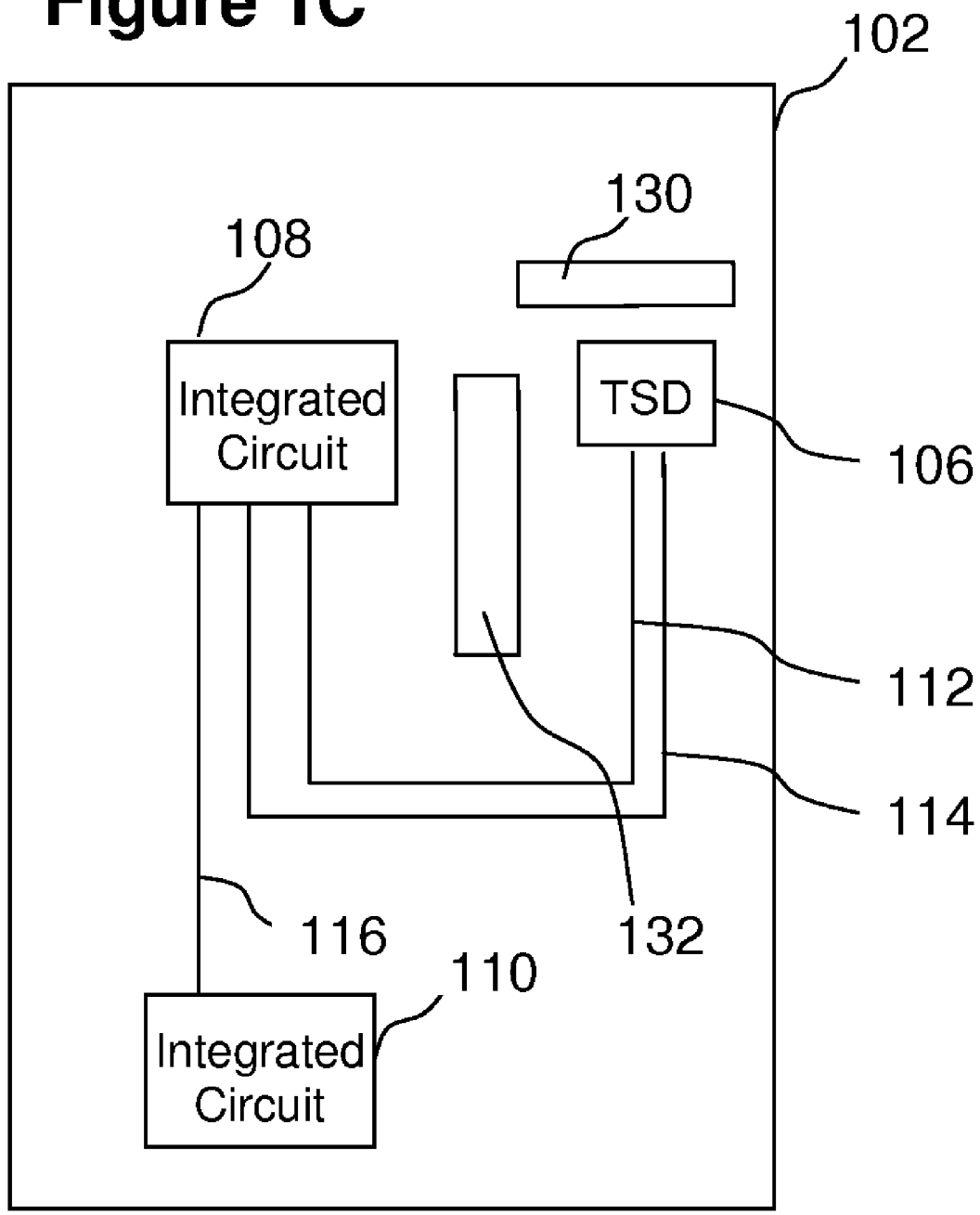

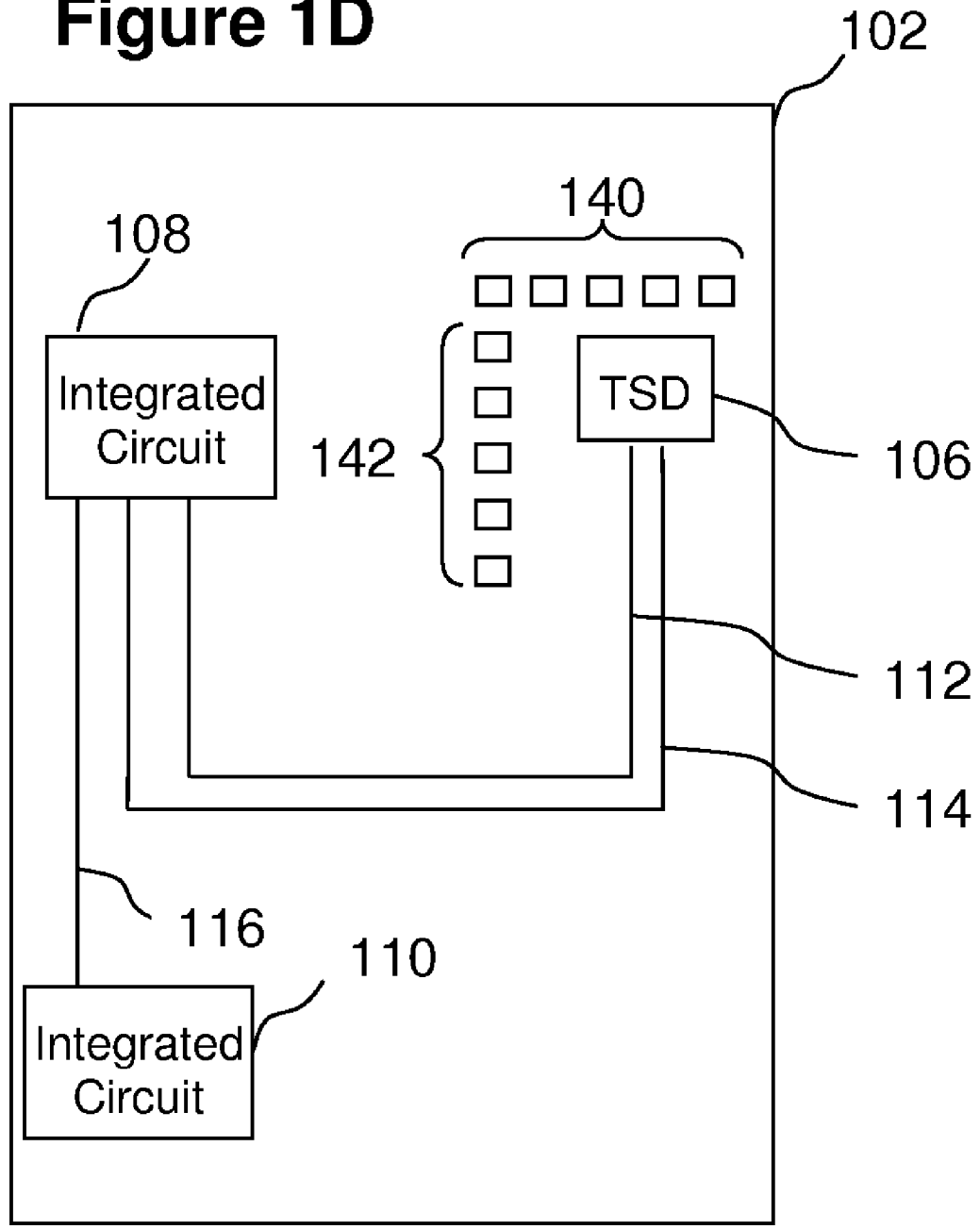

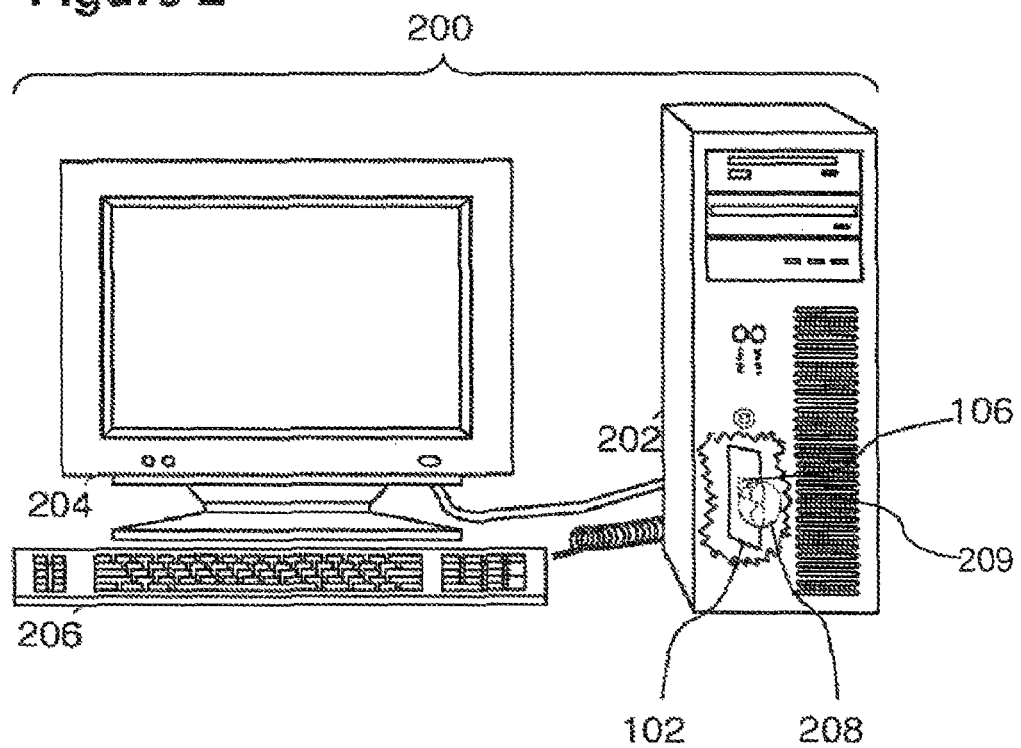

INSULATING APERTURE IN PRINTED CIRCUIT BOARDS

BACKGROUND

Virtually every electronic device includes one or more varieties of printed circuit boards ("PCBs"). PCBs are relatively thin, layered substrates upon which integrated circuits and other electronic components are attached. A printed circuit board typically includes a plurality of electrically conductive and insulating layers arranged in a sandwich-like fashion. Conductive layers generally have conductive paths or traces, isolated from one another by the insulating material of the insulating layers, and routed within a plane. These traces are generally designed to electrically contact conductive portions of the electronic components mounted on the PCB, forming electrical interconnects. Insulating layers electrically isolate these conductive paths from one another. The principle structure of conductive traces and layers of insulating material is also used on a smaller scale within a packaged microchip having a PCB-like package substrate.

In numerous situations, temperature sensitive devices are coupled to PCBs. However, these temperature sensitive devices are negatively affected by the heat produced by integrated circuits and devices coupled to the PCB near the temperature sensitive devices. To minimize this effect, all unnecessary conductive material is removed from around the temperature sensitive devices. Thus, the non-conductive material, which in most cases is FR4, is used as an insulator. However, heat still may affect the temperature sensitive devices negatively. Thus, it would be desirable to design a system which lowers the heat effect on temperature sensitive devices coupled to PCBs.

BRIEF DESCRIPTION OF THE DRAWINGS

For a detailed description of exemplary embodiments of the invention, reference will now be made to the accompanying drawings in which:

FIGS. 1A, 1B, 1C, and 1D show exemplary embodiments of a printed circuit board in accordance with embodiments of the invention;

FIG. 2 shows an exemplary computer system which includes a printed circuit board in accordance with an embodiment of the invention.

NOTATION AND NOMENCLATURE

Figure 3:
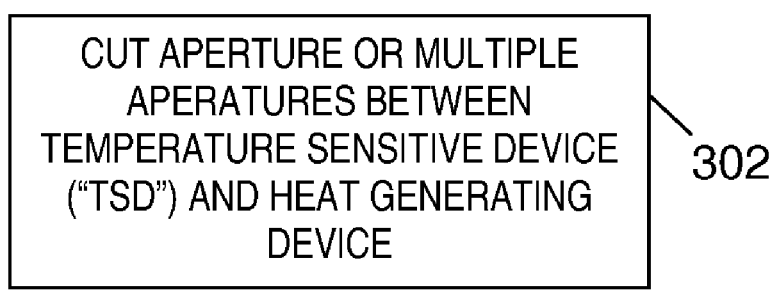
FIG. 3 shows an exemplary flow diagram of a method implemented in accordance with embodiments of the invention.

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

FIG. 1A shows a printed circuit board ("PCB") 102 in accordance with an embodiment of the invention. PCB 102 includes integrated circuits 108 and 110. However, PCB 102 may also include numerous other integrated circuits and devices. Integrated circuits 108 and 110 create heat which may spread across PCB 102. For example, integrated circuit 108 may be a processor which dissipates tremendous amounts of heat. PCB 102 also includes conductive traces 112, 114, and 116. Traces 112, 114, and 116 are generally designed to electrically contact conductive portions of the electronic components mounted on the PCB, thereby forming electrical interconnects. Traces 112, 114, and 116 are etched into PCB 102 during PCB 102's fabrication and are made of, for example, copper.

FIG. 1A also shows a temperature sensitive device ("TSD") 106 mounted on PCB 102. Although temperature sensitive device 106 may be coupled to PCB 102 anywhere on PCB 102, it is preferable to couple temperature sensitive device 106 near the edge of PCB 102. Also, although only one temperature sensitive device is shown, multiple temperature sensitive devices may be present on PCB 102. Temperature sensitive device 106 is contemplated as being an integrated circuit coupled to PCB 102 that is capable of measuring the temperature of leads from PCB 102 at the location the temperature sensitive device 106 is coupled to PCB 102. Thus, the temperature of PCB 102 is measured by temperature sensitive device 106. Temperature sensitive device 106 may also measure ambient air temperature at the location of temperature sensitive device 106. However, temperature sensitive device 106 does not have to be capable of measuring temperature. Temperature sensitive device 106 may be a device whose operation is temperature sensitive (e.g., a device whose operation is detrimentally effected by temperature).

The temperature experienced by temperature sensitive device 106 of PCB 102 is affected by integrated circuits 108 and 110 which create heat that dissipates through PCB 102. In accordance with various embodiments, to insulate temperature sensitive device 106 from the heat created by integrated circuits 108 and 110, aperture 104 is formed in (e.g., cut out of) PCB 102. In some embodiments, at the time of PCB 102's fabrication, copper traces (e.g., traces 112, 114) are not etched in locations where aperture 104 is expected to be located. One or more traces 112 or 114 must be present to connect temperature sensitive device 106 to other devices on PCB 102. Thus, three sides of temperature sensitive device 106 may be free of copper etches 112 and 114, and the area surrounding temperature sensitive device 106 resembles a peninsula.

In some embodiments, aperture 104 is created using a drill or routing bit to cut through PCB 102 in the area in which no copper is present. This is performed at the time the final outer shape of PCB 102 is cut. However, aperture 104 need not be cut out of PCB 102. For example, a mold may include aperture 104 as part of PCB 102 when PCB 102 is manufactured.

In various embodiments, aperture 104 extends to PCB 102's edge. Air fills aperture 104 and is used to insulate temperature sensitive device 106 from heat produced by other devices and circuits coupled to PCB 102. However, insulating mediums other than air may be used. For example, any insulating material that is resistant to electron motion may be used as aperture 104. However, air provides adequate insulation at significantly less cost. If an insulator other than air is used, such an insulator would preferably (but not necessarily) have a coefficient of conduction less than that of air to provide better thermal insulation than air.

In some embodiments, aperture 104 corresponds to the width of the drill bit used to cut the aperture. Thus, the minimum width of aperture 104 (represented in FIG. 1A by 107) may be equal to the diameter of the drill bit that cut it. However, the width of aperture 104 is not limited to being the diameter of the drill bit. The width of aperture 104 may be as wide or as thin as the user wishes, so long as the cut is made completely through all layers of PCB 102. For example, an aperture 104 cut using a laser may be less than one mil (1/1000 of an inch) wide, but would still work to thermally isolate temperature sensitive device 106.

In some embodiments, aperture 104 is interposed between temperature sensitive device 106 and the heat generating device, such as integrated circuits 108 and 110 to obtain thermal isolation. Aperture 104 is at least as long as temperature sensitive device 106 is wide and long. For example, FIG. 1A shows the width of temperature sensitive device as being represented by 111 and the length of temperature sensitive device as 113. Aperture 104 is at least as long as 111 and 113 in some embodiments. However, aperture 104 need not be any particular length so long as it is elongated. Aperture 104 may be as long or as short as the user wishes, so long as it is interposed between temperature sensitive device 106 and the heat generating device, such as integrated circuits 108 and 110. In some embodiments, aperture 104 is adjacent to temperature sensitive device 106, which is to say, aperture 104 is near enough to temperature sensitive device 106 so as to thermally insulate it.

Because temperature sensitive device 106 is thermally isolated from the heat generating integrated circuits 108 and 110, temperature sensitive device 106 is able to properly measure the temperature of PCB 102 at the location of temperature sensitive device 106 without feeling the effects from the heat created by integrated circuits 108 and 110 or any other integrated circuits or devices coupled to PCB 102.

FIG. 1B shows an alternative embodiment of PCB 102 in accordance with the invention. FIG. 1B is identical to FIG. 1A, except that aperture 120 is not cut in the same shape as aperture 104. Temperature sensitive device 106 is coupled to PCB 102 and is electrically connected to integrated circuits 108 and 110 by traces 112, 114, and 116. Aperture 120 is cut entirely through PCB 102, thus providing air to insulate temperature sensitive device 106 from heat produced by integrated circuits 108 and 110. However, aperture 120 does not extend to the edge of PCB 102. Thus, PCB 102 does not have any holes or apertures cut at location 122 of PCB 102. By not extending aperture 120 to the edge of PCB 102 the rigidity and stiffness of PCB 102 may be higher than that of FIG. 1A.

FIG. 10 shows an alternative embodiment of PCB 102 in accordance with the invention. In FIG. 10, two apertures 130 and 132 are cut from PCB 102. Temperature sensitive device 106 is coupled to PCB 102 and is electrically connected to integrated circuits 108 and 110 by traces 112, 114, and 116. Apertures 130 and 132 are cut entirely through PCB 102, thus providing air to insulate temperature sensitive device 106 from heat produced by integrated circuits 108 and 110.

FIG. 1D shows an alternative embodiment of PCB 102 in accordance with the invention. In FIG. 1D, multiple (more than two) apertures 140 and 142 are cut from PCB 102. Temperature sensitive device 106 is coupled to PCB 102 and is electrically connected to integrated circuits 108 and 110 by traces 112, 114, and 116. Apertures 140 and 142 are cut entirely through PCB 102 orthogonally, thus providing air to insulate temperature sensitive device 106 from heat produced by integrated circuits 108 and 110. As seen in FIGS. 1A, 1B, 1C, and 1D, so long as apertures 104, 120, 130, 132, 140, and 142 are interposed between temperature sensitive device 106 and the heat generating devices, such as integrated circuits 108 and 110, temperature sensitive device 106 will obtain some amount of thermal isolation.

FIG. 2 shows an exemplary computer system 200 which includes PCB 102 in accordance with the invention. System 200 is shown as a desktop computer 200, although any electronic device having some amount of computing power coupled to a user interface may be configured to include PCB 102. Among other things, servers, portable computers, personal digital assistants (PDAs) and mobile phones may be configured to include PCB 102.

As shown, system 200 comprises a chassis 202, a display 204, and an input device 206. The chassis 202 is coupled to the display 204 and the input device 206 to enable the user to interact with computer system 200. The display 204 and the input device 206 may together operate as a user interface. The display 204 is shown as a video monitor, but may take many alternative forms such as a printer, a speaker, or other means for communicating information to a user. The input device 206 is shown as a keyboard, but may similarly take many alternative forms such as a button, a mouse, a keypad, a dial, a motion sensor, a camera, a microphone or other means for receiving information from a user. Both the display 204 and the input device 206 may be integrated into the chassis 202.

The chassis 202 comprises a processor, memory, and information storage devices which are coupled to PCB 102. The chassis 202 may further comprise a network interface that allows the system 200 to receive information via a wired or wireless network. The chassis 202 also comprises a system fan 208. System fan 208 is designed to create an airflow which dissipates heat created by the processor and other integrated circuits coupled to PCB 102. A cutout is depicted in the chassis 202 to illustrate the PCB 102 and system fan 208 inside the chassis 202.

In some embodiments, temperature sensitive device 106 is located on PCB 102 directly in the outtake airflow of system fan 208. For example, as shown in FIG. 2, the PCB 102 is positioned such that the temperature sensitive device 106 is located directly in the stream of air generated by the system fan 208 that exhausts through a vent 209 in the chassis 202. As stated above, temperature sensitive device 106 may be used to measure the temperature of PCB 102 at the location of temperature sensitive device 106. Thus, because temperature sensitive device 106 is located directly in the outtake airflow of system fan 208, temperature sensitive device 106 may be used to measure the ambient air temperature being used to dissipate heat created by integrated circuits coupled to PCB 102. The ambient air temperature is used to generate acoustic friendly fan curves. Apertures 104, 120, 130, 132, 140, and 142 from FIGS. 1A, 1B, 1C, and 1D allow for more accurate fan curves. Fan curves are temperature versus fan speed graphs that show the rotations per minute the fan must make based on the temperature. Because apertures 104, 120, 130, 132, 140, and 142 insulate temperature sensitive device 106 from the heat created by integrated circuits 108 and 110, temperature sensitive device 106 more accurately measures the ambient air temperature. Thus, more accurate data is available for the generation of the fancurves which leads to more accurate fan curves.

The reading of air temperature may also be desirable in other areas of chassis 202. Thus, PCB 102 may be located anywhere inside chassis 202. For example, temperature sensitive device 106 may be needed to measure the air temperature in the back portion of chassis 202. Thus, this disclosure is not limited to PCB 102 being located directly in the outtake airflow of system fan 208.

FIG. 3 shows an exemplary flow diagram of a method 300 implemented in accordance with embodiments of the invention. The method comprises, in block 302, cutting aperture 104, 120, 130, 132, 140, or 142 entirely through PCB 102 so that it is interposed between a temperature sensitive device 106 on PCB 102 and a heat generating device, such as integrated circuits 108 or 110. As discussed above, in FIGS. 1A, 1B, 1C, and 1D, one or multiple apertures may be cut from PCB 102 to obtain thermal isolation for temperature sensitive device 106. At the time of fabrication of PCB 102, copper traces are not etched into PCB 102 in the locations that aperture 104, 120, 130, 132, 140, or 142 are to be cut. Because copper traces 112 and 114 are required in order to connect temperature sensitive device 106 to other devices mounted to PCB 102, up to three sides of temperature sensitive device 106 may be thermally isolated by apertures 104, 120, 130, 132, 140, and 142.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
a printed circuit board ("PCB") having layers; and
an aperture through the layers of the PCB interposed between a location for a temperature sensitive device and a location for a heat generating device to act as a thermal insulator;
wherein the aperture is to reduce an amount of thermal energy transferred from the heat generating device to the temperature sensitive device, and wherein the aperture has a first portion and a second portion that is angled with respect to the first portion, where the first portion is continuously formed with the second portion, the first portion extending to an edge of the PCB, and the second portion not extending to the edge of the PCB.

2. The system of claim 1, wherein the aperture is filled with an insulating medium selected from a group comprising of air and any material with a coefficient of conduction less than that of air.

3. The system of claim 1, wherein the temperature sensitive device measures either temperature of the PCB at the location the temperature sensitive device is coupled to the PCB or ambient air temperature at the location of the temperature sensitive device.

4. The system of claim 1, wherein the second portion is orthogonal to the first portion.

5. The system of claim 1, wherein the aperture has a third portion connecting the first and second portions, the first portion being continuously formed with the second portion through the third portion.

6. The system of claim 5, wherein the third portion is angled with respect to the first portion and angled with respect to the second portion.

7. The system of claim 1, wherein the aperture is filled with an insulating material having a coefficient of thermal conduction less than that of air.

8. A computer system, comprising:
a chassis having an exhaust vent and a system fan for generating an airflow;
a printed circuit board ("PCB") inside the chassis positioned between the system fan and the exhaust vent; and
a temperature sensitive device mounted on the PCB and positioned directly in the airflow of the system fan,
wherein an aperture through the PCB is interposed between the temperature sensitive device and a heat generating device; and
wherein the aperture has a first portion that extends to an edge of the PCB and a second portion that does not extend to the edge of the PCB, the first portion being angled with respect to the second portion, and the first portion being continuously formed with the second portion, the aperture to reduce an amount of thermal energy transferred from the heat generating device to the temperature sensitive device.

9. The computer system of claim 8, wherein the temperature sensitive device measures temperature of the PCB at a location the temperature sensitive device is coupled to the PCB or ambient air temperature at the location of the temperature sensitive device.

10. The computer system of claim 8, wherein the aperture is shaped so that the temperature sensitive device is thermally insulated by air on more than one side.

11. The system of claim 8, wherein the second portion is orthogonal to the first portion.

12. The computer system of claim 8, wherein the aperture has a third portion connecting the first and second portions, the first portion being continuously formed with the second portion through the third portion.

13. The computer system of claim 12, wherein the third portion is angled with respect to the first portion and angled with respect to the second portion.

14. The computer system of claim 8, wherein the aperture is filled with an insulating material having a coefficient of conduction less than that of air.

15. A method, comprising:
cutting an aperture entirely through a printed circuit board ("PCB") between a location for a temperature sensitive device and a location for a heat generating device;
wherein the aperture has a first portion that extends to an edge of the PCB, and a second portion that does not extend to the edge of the PCB, the first portion being angled with respect to the second portion, and the first portion being formed continuously with the second portion, the aperture to reduce an amount of thermal energy transferred from the heat generating device to the temperature sensitive device.

16. The method of claim 15, wherein the first portion is orthogonal to the second portion.

17. The method of claim 15, wherein the aperture has a third portion connecting the first and second portions, the first portion being continuously formed with the second portion through the third portion.

18. The method of claim 17, wherein the third portion is angled with respect to the first portion and angled with respect to the second portion.

19. The method of claim 15, wherein the aperture is filled with an insulating material having a coefficient of conduction less than that of air.

* * * * *